United States Patent [19]
Liu

[11] Patent Number: 5,476,803
[45] Date of Patent: Dec. 19, 1995

[54] METHOD FOR FABRICATING A SELF-SPACED CONTACT FOR SEMICONDUCTOR DEVICES

[76] Inventor: Kwo-Jen Liu, 2320 Cascade St., Milpitas, Calif. 95035

[21] Appl. No.: 323,756

[22] Filed: Oct. 17, 1994

[51] Int. Cl.⁶ .............................................. H01L 21/823
[52] U.S. Cl. .................. 437/44; 437/41; 437/913; 437/56
[58] Field of Search ........................ 437/44, 913, 246, 437/58, 41 RLD, 41 SW, 56

[56] References Cited

U.S. PATENT DOCUMENTS

| | | | |
|---|---|---|---|
| 4,745,080 | 5/1988 | Scovell et al. | 437/31 |
| 4,883,767 | 11/1989 | Gray et al. | 437/41 |
| 4,886,764 | 12/1989 | Miller et al. | 437/246 |
| 4,966,858 | 10/1990 | Masquelier et al. | 437/27 |
| 4,992,387 | 2/1991 | Tamura | 437/41 |
| 5,028,555 | 9/1991 | Haskell | 437/57 |
| 5,049,525 | 9/1991 | Coleman, Jr. | 437/195 |
| 5,098,854 | 3/1992 | Kapoor et al. | 437/31 |
| 5,100,838 | 3/1992 | Dennison | 437/195 |
| 5,106,783 | 4/1992 | Chin et al. | 437/195 |
| 5,149,664 | 9/1992 | Shin et al. | 437/41 |
| 5,175,127 | 12/1992 | Manning | 437/195 |
| 5,183,773 | 2/1993 | Miyata | 437/44 |
| 5,217,913 | 6/1993 | Watabe et al. | 437/44 |
| 5,217,923 | 6/1993 | Suguro | 437/44 |
| 5,227,319 | 7/1993 | Ogura et al. | 437/58 |
| 5,393,685 | 2/1995 | Yoo et al. | 437/44 |

Primary Examiner—Brian E. Hearn
Assistant Examiner—Michael Trinh
Attorney, Agent, or Firm—Jeffrey P. Aiello

[57] ABSTRACT

A method for fabricating semiconductor devices with a self-spaced contact is provided. Spacing required between the self-spaced contact and a gate region is lessened, thus reducing chip size, and parasitic capacitance and resistance. A transistor region includes a gate and diffusion region. A pad oxide layer comprises an uppermost layer of the gate. A spacer oxide is formed on side walls of the gate region. The thickness of the pad oxide layer controls the width of the spacer oxide region. The spacer oxide insulates the gate from the diffusion regions, so that electrical contacts may be formed close to the gate for reducing the overall size of the semiconductor device. The doping structure of the diffusion regions is controlled by the width of the spacer oxide regions. Thus, the doping structure of the diffusions can be altered to reduce parasitic capacitance and resistance.

11 Claims, 3 Drawing Sheets

METHOD FOR FABRICATING A SELF-SPACED CONTACT FOR SEMICONDUCTOR DEVICES

BACKGROUND OF THE INVENTION

1. Field of the Invention

This invention relates generally to semiconductor devices, and more particularly, to a method of fabricating a semiconductor device having a self spaced contact.

2. Description of Related Art

Higher circuit density and faster switching speed have been a major focus of recent developments in semiconductor technology. There are two related factors that limit the switching speed of semiconductor devices. First, the parasitic resistance between, for example on a bipolar transistor, the base contact and the active area of the transistor. Secondly, the parasitic capacitance between the base region and the collector region, for example. Each time the transistor switches, the base current charges or discharges the parasitic capacitance. The base current is further impeded by the parasitic base resistance. The speed of the semiconductor device is increased by reducing the product of the parasitic base resistance and the parasitic capacitance.

Metal Oxide Semiconductor (MOS) devices are also susceptible to parasitic capacitances and parasitic resistances. Further, as these devices are often used for memory devices, they typically have a great number of repetitive cells and are substantially large.

A number of different prior art processes have been disclosed for fabricating improved semiconductor devices. U.S. Pat. No. 5,098,854, to Kapoor et al., discloses a process for forming a self-aligned silicide base contact structure for bipolar transistors. The disclosed structure includes a base region, a polycrystalline silicon emitter contact region, a spacer oxide, and a base contact formed of metal silicide. The spacer oxide electrically isolates the side walls of the emitter contact region from the upper surface of the base region. The metal silicide is formed by first depositing a metal layer on the upper surface of the base region, then heat treating. Heat treating causes the metal atoms to diffuse into the underlying silicon substrate, and the silicon atoms diffuse into the overlying metal layer, thus forming an electrically conductive compound.

U.S. Pat. No. 5,106,783, to Chin et al., discloses a process for fabricating a semiconductor device having self-aligned contacts. The disclosed process provides a digitated electrode having a contiguous conductive region that contacts underlying first and second semiconductor regions. The second semiconductor region underlies a finger of the electrode. The contiguous conductive region enables the first semiconductor region to contact the second semiconductor region with a common electrode, and further self-aligns the common electrode with the digitated electrode.

U.S. Pat. No. 4,745,080, to Scovell et al., discloses a method of making a self-aligned bipolar transistor. The disclosed device is achieved by providing oxidized sidewalls of an emitter mesa as part of a p+ base contact implantation mask. Collector contact alignment is achieved by using oxidized sidewalls of polycrystalline silicon alignment mesas defined in the same polysilicon as the emitter mesa, but deposited on oxide, rather than the implanted base region.

Known patents for fabricating semiconductor devices that might be considered to have a degree of relevance to the present invention are U.S. Pat. Nos. 5,175,127; 5,100, 838; 5,149,664; 5,049,525; 4,883,767; 4,966,858; 5,217,913; 4,992,387; and 5,028,555.

Although the semiconductor devices disclosed in the above enumerated prior art references have improved switching speed and dimensional scaling, they fail to disclosed all of the advantageous features achieved by the present invention.

OBJECTS OF THE INVENTION

There therefore exists a need for semiconductor device having improved switching speed and substantially reduced size.

It is therefore an object of the present invention to provide an improved method for fabricating a semiconductor device having improved switching speed, and substantially reduced size;

It is another object of the present invention to provide an improved method for fabricating a semiconductor device having controllable leakage current and improved reliability;

It is a further object of the present invention to provide an improved method for fabricating a semiconductor device that has reduced parasitic capacitance;

It is yet another object of the present invention to provide a method for fabricating a semiconductor device that has reduced parasitic resistance;

It is another object of the present invention to provide a method for fabricating a semiconductor device such as a MOS device with having controllable leakage current and improved reliability;

It is still another object of the present invention to provide a method for fabricating a semiconductor device having a substantially larger number of repetitive cells, such as a memory semiconductor device having reduced size; and It is a still further object of the present invention to provide a method for fabricating a semiconductor device where the structures of the diffusion regions may be controlled during the fabrication process.

SUMMARY OF THE INVENTION

These and other objects and advantages of the present invention are achieved by providing an improved method for fabricating a semiconductor device. The fabrication method of the present invention can be used to manufacture bipolar transistors and Metal Oxide Semiconductor (MOS) devices. The invented fabrication method can further be applied to the manufacture of printed circuit boards, where space reduction, between conductive circuitry and unrelated conductive layers, would help to decrease the size of circuit boards.

Semiconductor devices are fabricated by the invented process, by first growing field oxide regions to define a multiplicity of transistor regions on a lightly doped silicon substrate, such as a polysilicon substrate. The transistor regions are surrounded by field oxide regions. A gate region for each transistor is then formed by first growing a gate oxide layer over the field oxide regions and substrate. A layer of polysilicon is deposited over the gate oxide layer. A silicide is formed over the polysilicon layer. A substantially thick pad oxide layer is deposited over the silicide. The device is then etched to form a multiplicity of self-aligned gate regions having side walls.

The transistor regions are then lightly doped with N– impurities to form buried diffusion regions in the substrate. The diffusion regions are separated by a channel region in the substrate located beneath the gate region. A covering oxide is deposited over the transistor. The oxide is then anisotropically etched leaving a portion of the covering oxide along the side walls of the gate region to form a spacer oxide region. The spacer oxide electrically insulates the gate from the diffusion regions. Thus, electrical contact can be made to the diffusion region, substantially close to the gate of the transistor.

The pad oxide layer of selected gate regions may then be etched. The individual etching of desired pad oxide layers, enables different gate regions on the same substrate to have pad oxide layers of random thicknesses. The thickness of the pad oxide layer on the selected gates is reduced, to reduce the width of desired spacer oxide regions to control the doping structure of the diffusion regions. The pad oxide layer may be etched to any desired thickness, until the pad oxide is completely removed. Controlling the doping structure of the diffusion regions, enables parasitic capacitance and resistance can be reduced, punch-through voltage can be monitored, leakage current of the transistor can be controlled, current through the substrate can be monitored, and device reliability can be improved.

Arsenic, for example, is then implanted into the substrate to heavily dope the diffusion regions to enhance the conductivity of the diffusion regions. A covering oxide is then deposited over the substrate. A masking step is applied to the covering oxide, then the oxide is etched to is open windows through the covering oxide to the diffusion regions to provide self-spaced contacts to the diffusion regions. The contacts are formed substantially close to the gate regions, since the spacer oxide insulates the gate region from the contacts. An electrically conductive layer, such as a conductive metal is deposited over the substrate and contacts the diffusion regions. The conductive layer couples to the diffusion regions substantially close to the transistor's gate without electrically shorting, due to the insulation provided by the spacer oxide regions. The conductive layer is then etched to form desired circuitry.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, in which:

DESCRIPTION OF THE PREFERRED EMBODIMENTS

The following description is provided to enable any person skilled in the art to make and use the invention and sets forth the best modes contemplated by the inventor of carrying out his invention. Various modifications however, will remain readily apparent to those skilled in the art, since the generic principles, to fabricate a semiconductor device on a production basis of the present invention have been defined herein.

Although the fabrication process and structure of the present invention as described in terms of a Metal Oxide Semiconductor (MOS) device formed on a p- substrate, it will be understood that the fabrication method of the present invention can be used to manufacture n-p-n transistors, bipolar transistors, and memory oriented semiconductor devices which incorporate numerous repetitive cells. The invented fabrication method can further be applied to the manufacture of printed circuit boards, where space reduction, between conductive circuitry and unrelated conductive layers, would help to decrease the size of circuit boards, while avoiding the problem of electrical shorting.

While a transistor embodying a self-spaced contact formed on a polycrystalline silicon substrate is constructed during the fabrication process of the present invention, as shown in FIGS. 1–9, it will be understood that numerous such devices can be formed simultaneously on the same substrate.

Figure 1:
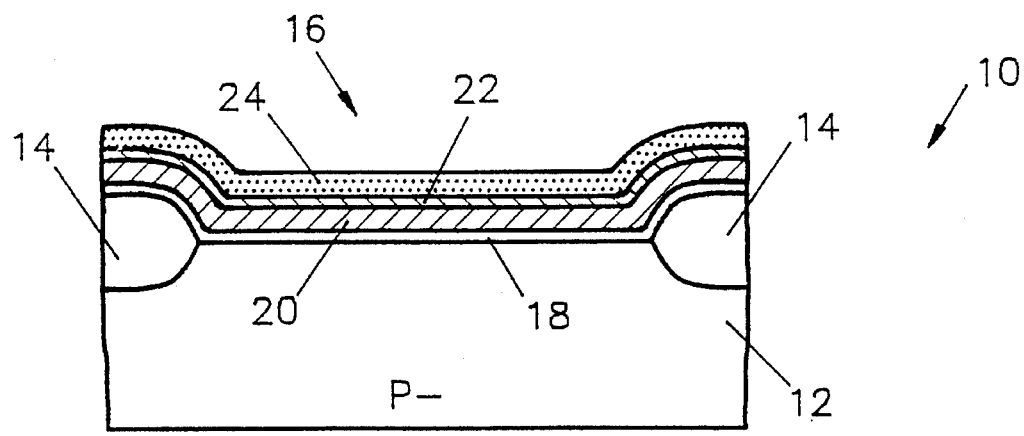
FIG. 1 is a sectional view of a semiconductor device after a series of preliminary steps of the fabrication process of the present invention have been performed.

Referring now to FIG. 1 of the drawings, there is shown a section of a semiconductor device 10, after a series of preliminary steps have been performed. A lightly doped p- silicon substrate 12 is provided. A field oxide layer 14 is grown on the substrate 12 for defining a transistor region 16. A gate oxide layer 18, comprising silicon dioxide for example, is then epitaxially grown over the substrate 12. A polysilicon layer 20 is then deposited over the gate oxide 18. The polysilicon layer 20 is deposited using well known techniques, such as chemical vapor deposition, for example.

A silicide 22 is then formed over the polysilicon layer 20. The silicide 22 is formed by depositing a conductive metal layer over the polysilicon layer 20. The device 10 is then heat treated at an elevated temperature for a time period sufficient to form the electrically conductive silicide 22. During heat treating, metal atoms diffuse into the underlying polysilicon layer 20 and silicon atoms from the polysilicon layer 20 diffuse into the metal to form the silicide 22. The conductive metal used for the silicide 22 may comprise any suitable conductive metal such as titanium, tungsten, or molybdenum for example. The silicide 22 is formed to reduce sheet resistance of the polysilicon 20. A substantially thick pad oxide layer 24 is then deposited over the silicide 22. The pad oxide layer 24 may be between 1000 to 3000 Angstroms thick. In the preferred embodiment, the pad oxide layer 24 is substantially 2000 Å thick.

Figure 2:
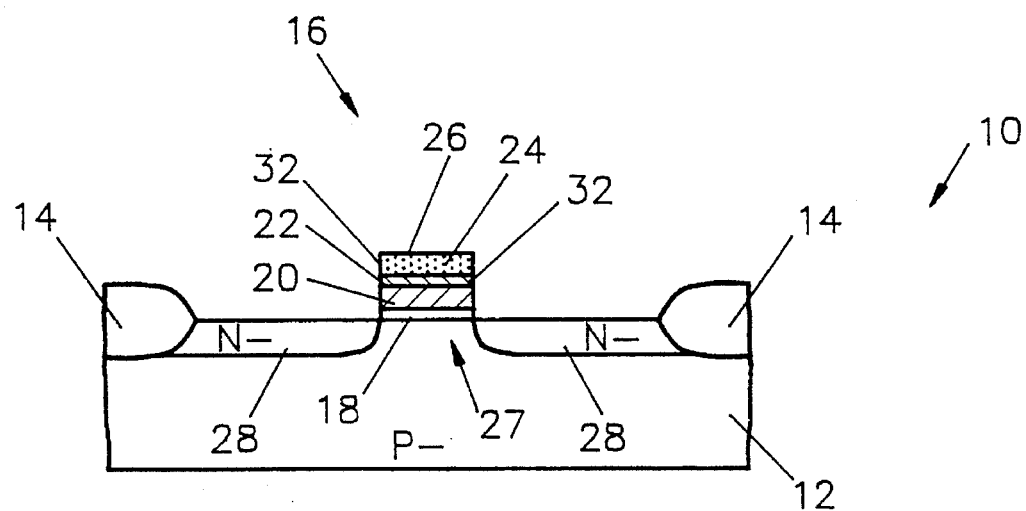
FIG. 2 is a sectional view of a semiconductor device after a first preliminary step of the fabrication process of the present invention has been performed.

Referring now to FIG. 2 of the drawings, a photolithographic mask (not shown), herein after referred to as a photomask, is then applied to the device 10. The photomask is then patterned and portions of the layers 18, 20, 22, 24 are etched to define a gate region 26 having substantially vertical side walls 32. A channel region 27 extends under the gate region 26 in the substrate 12. N type (donor) impurity atoms are then implanted into the substrate 12 to form lightly doped buried diffusion regions 28. The diffusion regions 28 act as the source/drain regions for MOS transistors and are separated by the channel region 27.

Figure 3:
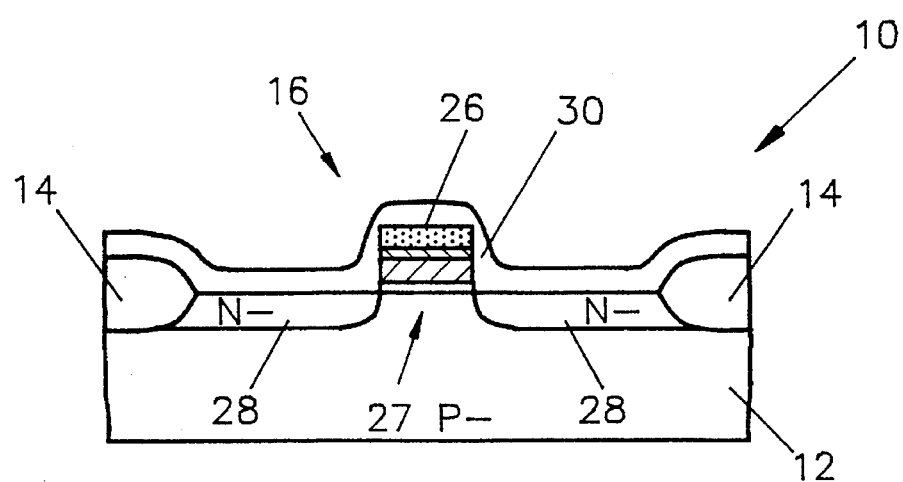
FIG. 3 is a sectional view of a semiconductor device after a second preliminary step of the fabrication process of the present invention has been performed.

FIG. 3 of the drawings, shows a covering oxide 30 deposited over the transistor region 16. The covering oxide 30 may be between 1000 Å to 3000 Å thick. In the preferred embodiment, the covering oxide 30 is substantially 2000 Å thick.

Figure 4:
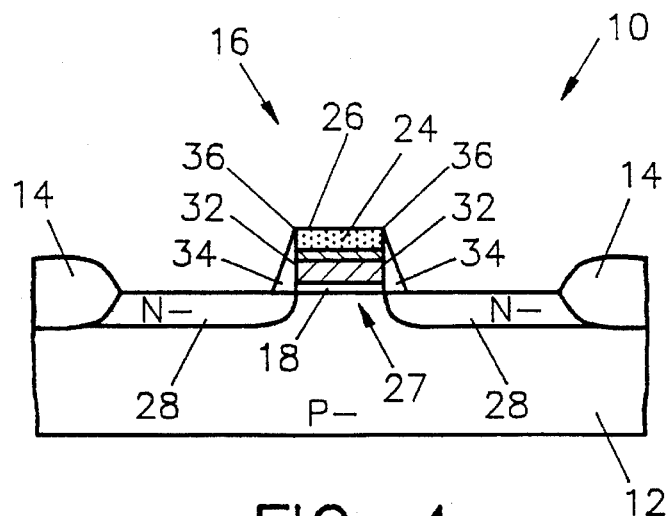
FIG. 4 is a sectional view of a semiconductor device after a third preliminary step of the fabrication process of the present invention has been performed.

FIG. 4 shows that an anisotropic etch has been applied to the device 10 to remove the covering oxide 30. Anisotropic etching etches in a substantially vertical, uniformly blanket direction. The anisotropic etching, etches the covering oxide 30 until the diffusion region 28 in the substrate 12 is reached. A portion of the covering oxide 30 remains along the side walls 32 to form spacer oxide regions 34. The spacer oxide regions 34 slope tangentially between a top edge 36 of the gate region 26 to the diffusion regions 28, due to the anisotropic etching. The pad oxide layer 24 remains after the anisotropic etching. The spacer oxide 34 provides electrical insulation between the gate region 26 and diffusion regions 28. The spacer oxide 34 may be between 2000–5000 Å thick at its thickest point, where the gate region 26 is formed on the substrate 12.

Figure 5:
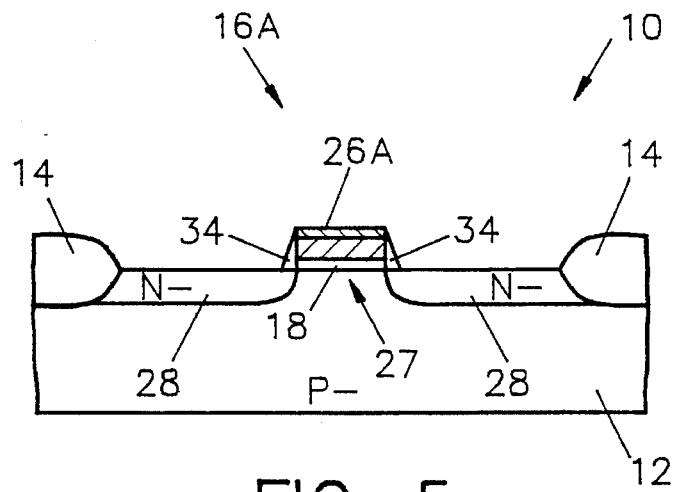
FIG. 5 is a sectional view of a semiconductor device after an alternative, additional step of the fabrication process of the present invention has been performed.

Referring now to FIG. 5 of the drawings, there is shown the semiconductor device 10, with a gate region 26A where the pad oxide layer 24 has been substantially etched away. It may be desired to reduce the thickness of the pad oxide layer 24 for reducing the width of the spacer oxide regions 34. The slope of the spacer oxide regions 34 may be altered by changing the etching method when the spacer oxide regions 34 are formed. The width of the spacer oxide regions 34 may be reduced for controlling the doping structure of the diffusion regions 28, to control conductivity through the channel region 27. A photomask can be patterned to cover gate regions 26 on the substrate 12 where the pad oxide layer 24 is to remain unchanged, as shown in FIG. 4. Uncovered gates 26 are then etched until the desired thickness of the pad oxide 24 is achieved. The pad oxide 24 may be etched to any desired thickness, until the pad oxide 24 is completely removed as shown in FIG. 5. A series of different photomasks may be applied and patterned to etch, all or any desired portion, of the pad oxide layer 24 from as many gate regions 26 as desired, all of which are formed on the same substrate 12. As the pad layer 24 is etched away from the desired gate regions 26, the width of the spacer oxide regions 34 is reduced.

Figure 6:
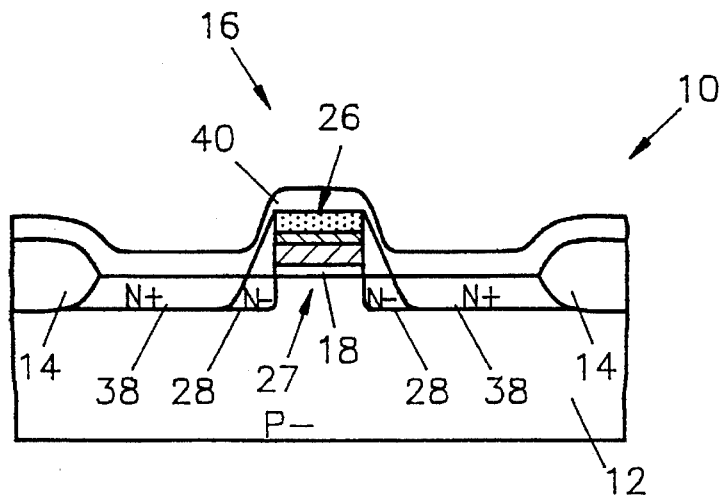
FIG. 6 is a sectional view of a semiconductor device after a fourth preliminary step of the fabrication process of the present invention has been performed.
Figure 7:
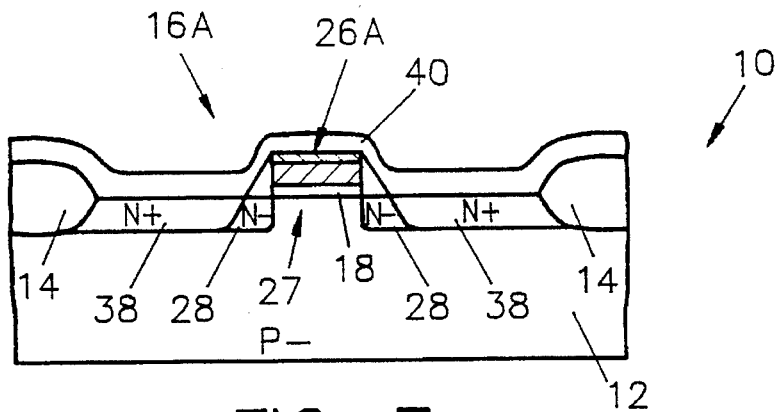
FIG. 7 is a sectional view of a semiconductor device after a fourth preliminary step after the alternative, additional step of the fabrication process of the present invention has been performed.

Referring now to FIGS. 6 and 7 of the drawings, the diffusion regions 28 in the substrate 12, are implanted with N+ ions 38, such as Arsenic, to heavily dope the diffusion regions 28 for changing the doping structure thereof. Altering the doping structure of the diffusion regions 28, controls the conductivity of the channel region 27, and further aids in reducing the parasitic capacitance and resistance of the regions 28, due to the constant switching of the transistor 16.

An isolation oxide 40 is uniformly deposited over the transistors 16. The isolation oxide 40 is applied to prevent the transistor 16 from electrically shorting. The isolation oxide 40 isolates electrically conductive material, not yet deposited, from the gate region 26. The isolation oxide 40 further electrically isolates the gate region 26 from the diffusion regions 28. After the isolation oxide 40 is deposited, a photomask is applied and patterned.

Figure 8:
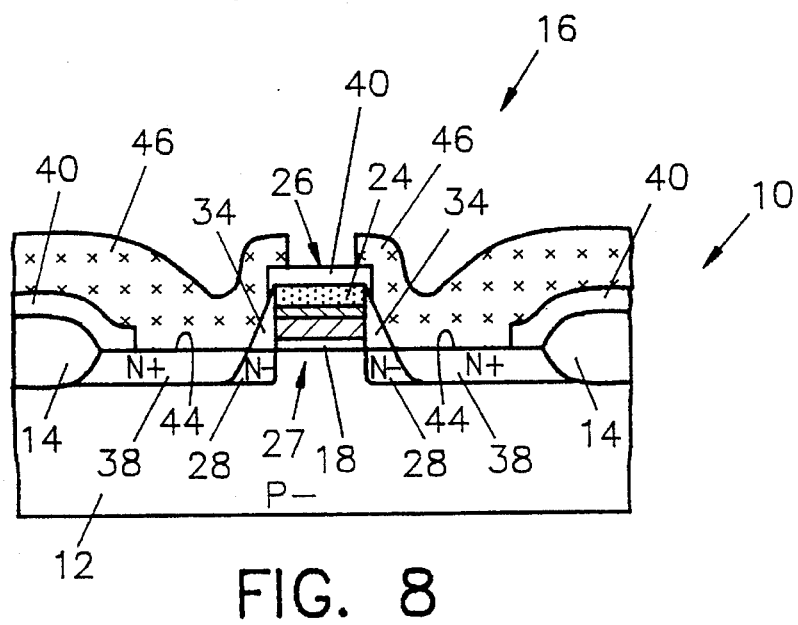
FIG. 8 is a sectional view of a semiconductor device after a fifth preliminary step of the fabrication process of the present invention has been performed.
Figure 9:
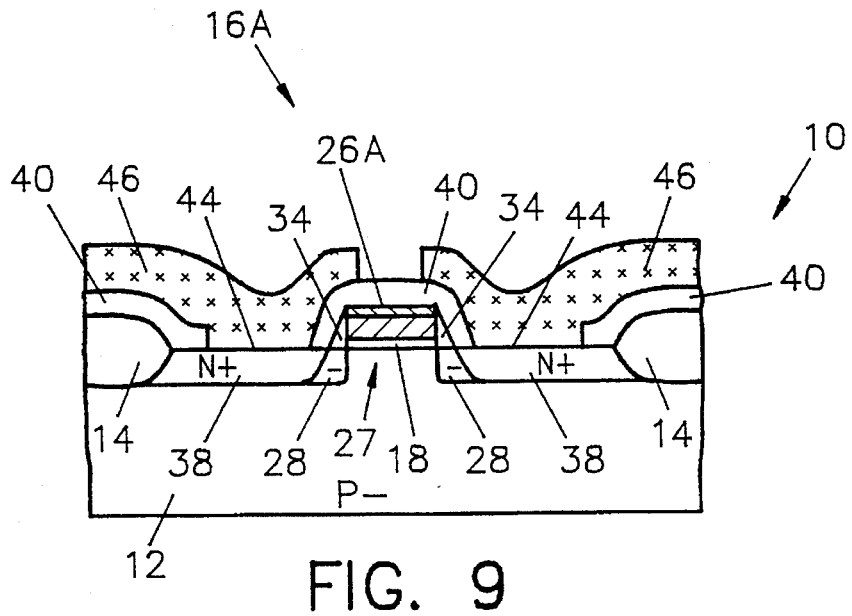
FIG. 9 is a sectional view of a semiconductor device after a fifth preliminary step after the alternative, additional step of the fabrication process of the present invention has been performed.

Referring to FIGS. 8 and 9, desired portions of the isolation oxide 40 have been etched to form a window to a contact 44 to the diffusion regions 38 in the substrate 12. As can be seen in FIG. 9 the distance from the contact 44 to gate region 26A is substantially large, due to the combined width of the isolation oxide 40 and the spacer oxide regions 34. The combined width of the isolation oxide 40 and the spacer oxide regions 34 is typically between 0.4–0.8 µM. Since the pad oxide layer 24 is substantially etched, the width of the spacer oxide regions 34 is somewhat diminished, and thus would not prevent the transistor 16 from shorting.

As can be seen in FIG. 8, a pad oxide layer 24 of substantial thickness provides spacer oxide regions 34 that have sufficient width to prevent the transistor 16 from shorting. The width of the spacer oxide regions is substantially 0.2–0.5 µM, with a pad oxide layer 24 that has not been etched. Thus, the contact-to-gate region spacing, of a gate region 26 with a substantial pad oxide layer 24 is substantially less than the spacing required between the contact-to-gate region spacing for a gate region 26A without the pad oxide layer 24. Therefore, the size of the semiconductor device 10 can be reduced.

By controlling the doping structure of the diffusion regions 28 a number of advantages can be achieved. Firstly, the leakage current through the channel region 27 can be controlled. Secondly, punch-through voltage through the channel region 27 can be monitored. Further, the conductivity of the diffusion regions can be controlled. Also reliability of the semiconductor device 10 can be improved. Parasitic capacitance and channel resistant can also be reduced by controlling the doping structure of the diffusion regions 28.

As can be clearly seen, the thickness of the pad oxide layer 24 can be somewhat reduced, while the spacer oxide regions 34 have sufficient width to prevent the transistor 16 from shorting. A desired width of the spacer oxide regions 34 can be achieved by reducing the thickness of the pad oxide layer 24, until the desired width of the spacer oxide 34 is achieved. The relationship of the spacer oxide region 34 width to pad oxide layer 24 thickness can be further investigated through experimentation, by slightly changing the thickness of the pad oxide 24, and finding the resulting width of the spacer oxide 34. This process can be repeated, to extrapolate the data for determining the relationship between pad oxide 24 thickness and spacer oxide 34 width.

After the contacts 44 have been formed, a desired conductive material 46 is deposited over the transistor 16. The conductive material 46, which may comprise a suitable conductive metal or conductive polysilicon for example, connects to the contacts 44 for electrically coupling to the N+ 38 portions of the diffusion regions 28. The conductive material 46 is then etched to form desired circuitry of the semiconductor device 10 of the present invention.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A method of forming a multiplicity of self-spaced contacts on a semiconductor device, said method comprising the steps of:

providing a lightly doped silicon substrate of a first conductivity type;

selectively growing a multiplicity of field oxide regions for defining a multiplicity of transistor regions, each transistor region surrounded by field oxide regions;

growing a gate oxide layer over said field oxide regions and said substrate;

depositing a layer of polysilicon over said gate oxide;

depositing a layer of conductive metal over said layer of polysilicon;

heating said layer of metal at an elevated temperature for a period of time sufficient for a silicide to form between said metal and said polysilicon;

depositing a pad oxide layer having a thickness over said silicide;

selectively simultaneously removing portions of said gate oxide, said polysilicon, said silicide, and said pad oxide to form a multiplicity of self-aligned gate regions having vertical side walls;

doping said transistor regions with impurities of a first conductivity type to form buried diffusion regions;

depositing a covering oxide over said multiplicity of transistor regions;

anisotropically etching said covering oxide layer such that a portion of said covering oxide slopes tangentially between a top edge of each of said gate regions and said substrate for forming a spacer oxide region along the side walls of said gate regions, said spacer oxide regions having a width;

selectively reducing the thickness of the pad oxide layer of selected gate regions of said multiplicity of gate regions to reduce the width of said spacer oxide regions and to control the doping structure of said diffusion regions, the thickness of the pad oxide layer of desired selected gate regions of said selected gate regions being reduced independently of other gate regions of said selected gate regions, such that the multiplicity of said gate regions have pad oxide layers that range in thickness from unaltered to nil;

doping said substrate with impurities of a second conductivity type to heavily dope said diffusion regions;

depositing a second covering oxide over said substrate;

selectively removing portions of said second covering oxide to provide a multiplicity of self-spaced contacts on said diffusion regions, one contact for each diffusion region, said contacts formed adjacent to said spacer oxide regions and interposed between said spacer oxide regions and remaining portions of said second covering oxide;

depositing a desired electrically conductive layer over said substrate to connect to said contacts adjacent to said spacer oxide regions;

selectively removing portions of said conductive layer to form desired integrated circuitry having electrical contacts disposed adjacent to said gate regions for reducing semiconductor device size.

2. The method of claim 1 wherein said conductive layer comprises a desired one of an electrically conductive metal and an electrically conductive polysilicon.

3. The method of claim 2 wherein said electrically conductive metal is a metal selected from the group consisting of aluminum and gold alloy.

4. The method of claim 1 wherein said pad oxide layer is substantially 2000 angstroms thick before reduction.

5. The method of claim 1 wherein said spacer oxide regions electrically insulate said gate region from said contacts.

6. The method of claim 1 wherein the width of the lightly doped portion of said diffusion regions is reduced by reducing the thickness of the pad oxide layer of said gate regions to reduce the width of said spacer oxide regions for controlling a conductivity of said diffusion regions.

7. A method of forming a multiplicity of self-spaced contacts on a semiconductor device, said method comprising the steps of:

providing a lightly doped silicon substrate of a first conductivity type;

selectively growing a multiplicity of field oxide regions for defining a multiplicity of transistor regions, each transistor region surrounded by field oxide regions;

growing a gate oxide layer over said field oxide regions and said substrate;

depositing a layer of polysilicon over said gate oxide;

depositing a layer of conductive metal over said layer of polysilicon;

heating said layer of metal at an elevated temperature for a period of time sufficient for a silicide to form between said metal and said polysilicon;

depositing a thick pad oxide layer over said silicide;

simultaneously selectively removing portions of said gate oxide, said polysilicon, said silicide, and said pad oxide to form a multiplicity of self-aligned gate regions having side walls;

doping said transistor regions with impurities of a first conductivity type to form buried diffusion regions separated by a channel region in said substrate, a channel region extending under each of said gate regions;

depositing a covering oxide over said multiplicity of transistor regions;

anisotropically etching said covering oxide layer such that a portion of said covering oxide slopes between a top edge of each of said gate regions and said substrate for forming a spacer oxide region along the side walls of said gate regions, said spacer oxide regions having a width;

selectively reducing the thickness of the pad oxide layer of selected gate regions of said multiplicity of gate regions to reduce the width of said spacer oxide regions and to control the doping structure of said diffusion regions, the width of the lightly doped portion of said diffusion regions being reduced by reducing the thickness of the pad oxide layer of said gate regions to reduce the width of said spacer oxide for controlling a conductivity of said diffusion regions, the thickness of the pad oxide layer of desired selected gate regions of said selected gate regions being reduced independently of other gate regions of said selected gate regions, such that the multiplicity of said gate regions have pad oxide layers that range in thickness from unaltered to nil;

doping said substrate with impurities of a second conductivity type to heavily dope said diffusion regions;

depositing a second covering oxide over said substrate;

selectively removing portions of said second covering oxide to provide a multiplicity of self-spaced contacts on said diffusion regions, one contact for each diffusion region, said contacts formed adjacent to said spacer oxide regions and interposed between said spacer oxide regions and remaining portions of said second covering oxide;

depositing a desired electrically conductive layer over said substrate to connect to said contacts adjacent to said spacer oxide regions;

selectively removing portions of said conductive layer to form desired integrated circuitry having electrical contacts disposed adjacent to said gate regions for reducing semiconductor device size.

8. The method of claim 7 wherein said conductive layer comprises a desired one of an electrically conductive metal and an electrically conductive polysilicon.

9. The method of claim 8 wherein said electrically conductive metal is a metal selected from the group consisting of aluminum and gold alloy.

10. The method of claim 8 wherein said pad oxide layer is substantially 2000 angstroms thick before reduction.

11. The method of claim 7 wherein said spacer oxide regions electrically insulate said gate regions from said contacts.

* * * * *